US007015482B2

(12) United States Patent
Sohda et al.

(10) Patent No.: US 7,015,482 B2
(45) Date of Patent: Mar. 21, 2006

(54) ELECTRON BEAM WRITING EQUIPMENT USING PLURAL BEAMS AND METHOD

(75) Inventors: Yasunari Sohda, Kawasaki (JP); Yoshinori Nakayama, Sayama (JP); Osamu Kamimura, Kokubunji (JP); Masato Muraki, Inagi (JP); Masaki Takakuwa, Tokyo (JP)

(73) Assignees: Hitachi, Ltd., Tokyo (JP); Canon Kabushiki Kaisha, Tokyo (JP); Advantest Corporation, Tokyo (JP)

( * ) Notice: Subject to any disclaimer, the term of this patent is extended or adjusted under 35 U.S.C. 154(b) by 20 days.

(21) Appl. No.: 10/354,959

(22) Filed: Jan. 31, 2003

(65) Prior Publication Data

US 2004/0021095 A1    Feb. 5, 2004

(30) Foreign Application Priority Data

Aug. 2, 2002   (JP) ............................ 2002-225973

(51) Int. Cl.
    *G21K 7/00*     (2006.01)
    *G21K 5/10*     (2006.01)

(52) U.S. Cl. .................. 250/442.11; 250/310; 250/311

(58) Field of Classification Search ................ 250/310, 250/311, 492.22, 492.23, 492.21, 492.3, 492.1, 250/492.2, 442.11
See application file for complete search history.

(56) References Cited

U.S. PATENT DOCUMENTS

| 6,137,113 | A  | * | 10/2000 | Muraki ................. 250/492.22 |
| 6,593,152 | B1 | * | 7/2003  | Nakasuji et al. ............. 438/14 |
| 6,624,430 | B1 | * | 9/2003  | Higuchi ................. 250/492.23 |
| 6,710,361 | B1 | * | 3/2004  | Pfeiffer et al. ......... 250/492.23 |

FOREIGN PATENT DOCUMENTS

| JP | 9-245708 | 9/1997 |
| JP | 10-64812 | 3/1998 |

* cited by examiner

*Primary Examiner*—John R. Lee
*Assistant Examiner*—Kalimah Fernandez
(74) *Attorney, Agent, or Firm*—Mattingly, Stanger, Malur & Brundidge, P.C.

(57) ABSTRACT

An electron beam writing system, using discrete electron beams in which the interval of the beams is larger than the size of the beams, generates plural electron beams, on/off controls each of the electron beams according to pattern data to be written, and deflects the electron beams together, thereby performing writing on a wafer. One side of a unit writing area of the electon beams is larger than substantially twice the interval of the electron beams or substantially an integral multiple thereof.

11 Claims, 8 Drawing Sheets

UNIT WRITING AREA 803   UNIT DATA AREA 804

ELECTRON BEAM WRITING EQUIPMENT USING PLURAL BEAMS AND METHOD

BACKGROUND OF THE INVENTION

The present invention relates to an electron beam writing technique for use in processing and writing of a Large Scale Integration circuit.

To cope with microfabrication of a Large Scale Integration circuit, a lithography technique has been developed continuously. In the extension of prior art optical lithography, shortage of resolution and difficulty in reticle manufacturing have been the problems. In electron beam lithography having an established reputation for resolution, increasing throughput has been tackled.

As a method for increasing throughput, as described in Japanese Patent Application Laid-Open No. 9-245708, there is a method for writing while scanning a micro unit area with multi point beams. In the method, an electron beam irradiated from one electron source is divided into multi electron beams by an aperture array to form an intermediate image by a lens array and a deflector array from the beams, and then, after on/off controlling each of the beams by a blanking array, the intermediate image is projected onto a wafer by projection optics including a deflector for writing. This method can correct field curvature and distortion caused in the projection optics by the lens array and the deflector array. The projection optics can be easily designed to realize high resolution and high throughput.

FIG. 1 shows the movement of an electron beam 102 on a wafer by the method. Each of multi electron beams is scanned at high speed in the range of a unit writing area 101 (the maximum writing area in which each of the multi electron beams can be deflection scanned successively). At this time, the beam is turned on/off at the position of each pixel 104 (49 pixels in FIG. 1) to form a pattern. The stitch of the unit writing areas 101 of the multi electron beams (64 multi beams in FIG. 1) is called a multi beam area 103. In this method, scanning 105 of the unit writing area 101 is basically performed to all the multi beams by the same deflector. Roughly, the unit writing areas 101 of the same size are formed. A plurality of the multi beam areas 103 are stitched horizontally to form a main field 106. The main fields are stitched vertically to form a stripe 107. The stripes are arrayed for write the entire surface of the wafer.

In this method, variations produced in the relative positions between the multi electron beams and the scanning distances and the electron currents in the unit areas, and deformation of the unit writing area cause deterioration of positioning accuracy and sizing accuracy in all the areas in the surface of the wafer. These variations are caused by a manufacture error of an electron optical element, an adjustment error of a driving circuit or non-uniformity of an electron gun.

An idea for improving part of the influence is shown in Japanese Patent Application Laid-Open No. 10-64812. As shown in FIG. 2, when a writing pattern 204 written with an electron beam 201 is across a unit writing area 203, an extended unit writing area 202 is set to write the pattern twice in an overlapped part to prevent the pattern from being cut. It is impossible to improve the positioning accuracy and the sizing accuracy in the entire writing area.

SUMMARY OF THE INVENTION

An object of the present invention is to provide an electron beam writing technique which can solve the above problems and improve the writing accuracy in the above electron beam writing system using discrete multi electron beams in which the interval of the beams is larger than the size of each of the beams.

To solve the above problems, in electron beam writing equipment according to the present invention, one side of a unit writing area of multi electron beams (the maximum writing area in which each of the multi electron beams can be deflection scanned successively) is larger than the interval of the electron beams (beam interval), for example, is larger than substantially twice the interval or substantially an integral multiple thereof. Otherwise, the area of the writing area is larger than the square of the beam interval of the multi electron beams.

In other words, the unit writing area must be increased to be contacted with another writing area of the electron beams away therefrom.

FIG. 3 shows an example when one side of a unit writing area 303 of the electron beams is set to be twice an interval 304 of the electron beams. The points on the wafer are written with peripheral multi electron beams (four in FIG. 3). All variations produced in the relative positions between the multi beams and the scanning distances and the electron currents in the unit areas can be averaged The writing accuracy can be improved.

Using this method, imaginarily, the area of 1/(integer)/(integer) (in this example, ¼) of the unit writing area 303 has no boundary between the multi beams. When handling data in this unit (that is, providing a unit data area 302 handled as a group of data smaller than the unit writing area 303), the data can be processed smoothly. In these writings, one electron beam performs writing at an electron beam center 301 adjacent in the direction of an adjacent electron beam, that is, at the position of the electron beam or near it when not performing deflection.

The electron beam writing equipment according to the present invention performs overwriting by shifting the center of the unit writing area of the multi electron beams. This is shown in FIGS. 4(a) and 4(b).

As shown in FIGS. 4(a) and 4(b), a multi beam area 402 is substantially shifted. In the drawing, the number of the multi beams is 16 for simplifying the description.

As shown in FIG. 4(a), the center of a unit writing area 401 of the electron beams is shifted by substantially an integral multiple of the interval of the electron beams for writing. Otherwise, as shown in FIG. 4(b), effectively, it is shifted by substantially an integral multiple and 1/integer of the interval of the electron beams.

In the former, in the case of twice shift shown in FIG. 4(a), the boundary of the unit writing area is basically at the same position. When the shapes of the unit writing areas have a common characteristic, the influence cannot be reduced. The sizes of the unit writing area and the unit data area can be the same. Data can be handled relatively simply.

In the latter, in the case of twice and ½ times shift shown in FIG. 4(b), multiple writings are performed at different positions in the unit writing area. When the shapes of the unit writing areas have the common characteristic, the influence can be reduced. For handling data, a data dividing method must be changed each time the unit writing area is shifted. The process is thus complex. The 1/integer is added because writing at the positions close to each other in the unit writing area can be prevented where possible at overwriting to make the effect significant. The shift operation must be done unlike the previous method. The unit writing area can be small.

In another aspect of the present invention, variation itself in the characteristics of the multi electron beams is reduced. The positions of the patterns written with the multi electron beams are measured by other measurement devices to correct the patterns.

More specifically, an optical position measurement device is used. The patterns as shown in FIGS. 5(a) and 5(b) are written to measure the positions. The number of the multi beams is also 16 for simplifying the description.

In a multi beam area 402 shown in FIGS. 5(a) and 5(b), on beams 403 are indicated in black and off beams 404 are indicated in white. When partially using the beams shown in FIG. 5(b), one beam is used for four unit writing areas 401. An oblong writing pattern 405 is long as nearly twice the interval of the electron beams. The longer measurement pattern is easily measured. This is a method for using a pattern written at a position closer to the center position of an adjacent electron beam than the center position of its own electron beam. At this time, it is effective to turn off the adjacent electron beam. The number of the electron beams used in writing in parallel is smaller than that of all the beams shown in FIG. 5(a). The optical position measurement has an accuracy higher than that of a typical electron beam position measurement. The position is not measured by its own electron beam to remove the influence of the habit of the writing equipment. These means can be used together with the above-mentioned two means.

Representative construction examples of the present invention will be described below.

Electron beam writing equipment according to the present invention has: means generating multi electron beams; means on/off controlling each of the multi electron beams according to pattern data that should be written; and means deflection scanning the on/off controlled electron beams together to form desired patterns on a wafer, wherein one side of each of unit writing areas of the multi electron beams is larger than the beam interval of the multi electron beams for writing. One side of the unit writing area is larger than substantially twice the beam interval of the electron beams. One side of the unit writing area is substantially an integral multiple of the beam interval of the electron beams.

Electron beam writing equipment according to the present invention has: means generating multi electron beams in parallel; means on/off controlling each of the multi electron beams according to pattern data that should be written; and means deflection scanning the on/off controlled multi electron beams together to form desired patterns on a wafer, wherein the center of the unit writing area of the multiple electron beams is shifted for overwriting. The center of the unit writing area is shifted by substantially an integral multiple of the beam interval of the electron beams for writing. The center of the unit writing area is shifted by substantially an integral multiple and substantially 1/integer of the beam interval of the electron beams for writing.

In the construction of the electron beam writing equipment, in order to detect electron currents of the multi electron beams, a plurality of Faraday cups arrayed corresponding to the multi electron beams are provided to detect variation in the multi electron beams.

An electron beam writing method according to the present invention has the steps of: on/off controlling each of the multi electron beams according to pattern data that should be written; and deflection scanning the on/off controlled multi electron beams together to form desired patterns on a wafer, wherein the positions of the patterns written with the multi electron beams are measured to obtain relative positions between the multi electron beams to correct the patterns. One side of each of unit writing areas of the multi electron beams is larger than the beam interval of the multi electron beams for writing. The positions of the patterns written with the multi electron beams are measured optically.

In the electron beam writing method, the position of a pattern written at a position closer to the center position of a second adjacent electron beam than the center position of a first electron beam of the multi electron beams is measured optically so as to correct the pattern.

DETAILED DESCRIPTION OF THE PREFERRED EMBODIMENTS

Preferred embodiments of the present invention will be described below with reference to the drawings.

(Embodiment 1)

Figure 1:
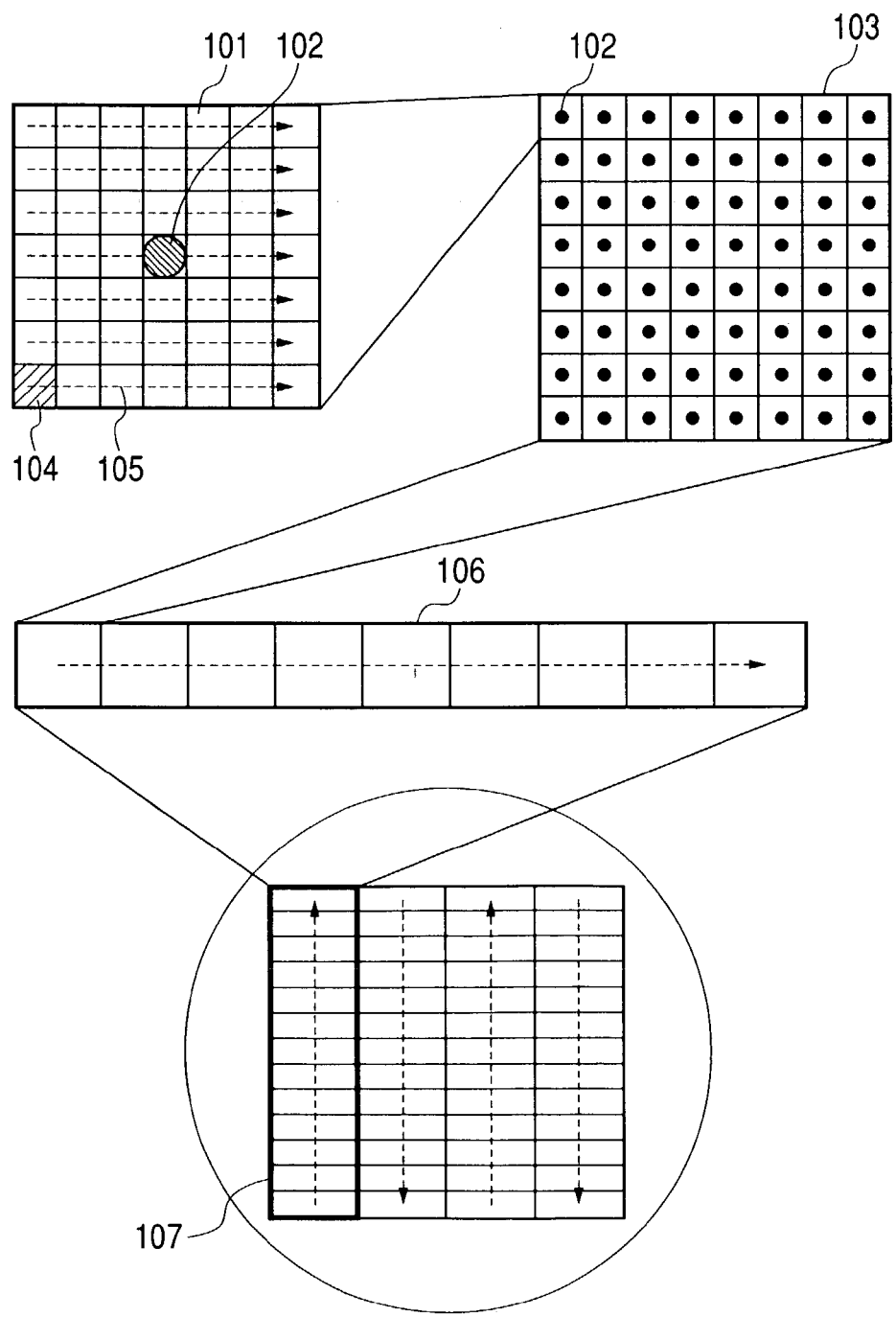
FIG. 1 is a diagram of assistance in explaining a writing area.
Figure 2:
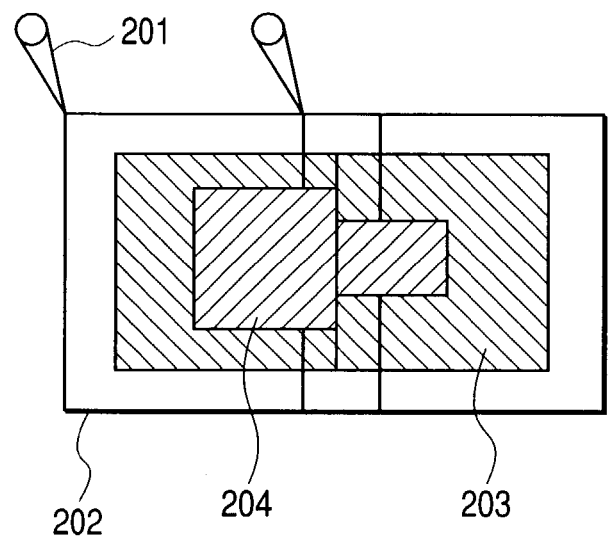
FIG. 2 is a diagram of assistance in explaining an example of a prior art writing method.
Figure 3:
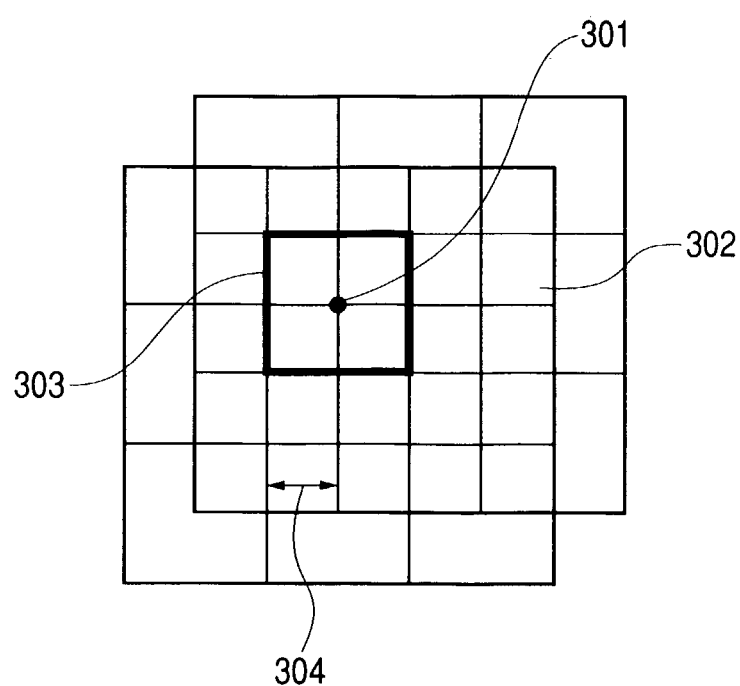
FIG. 3 is a diagram of assistance in explaining an example of a writing method according to the present invention.
Figure 4A:
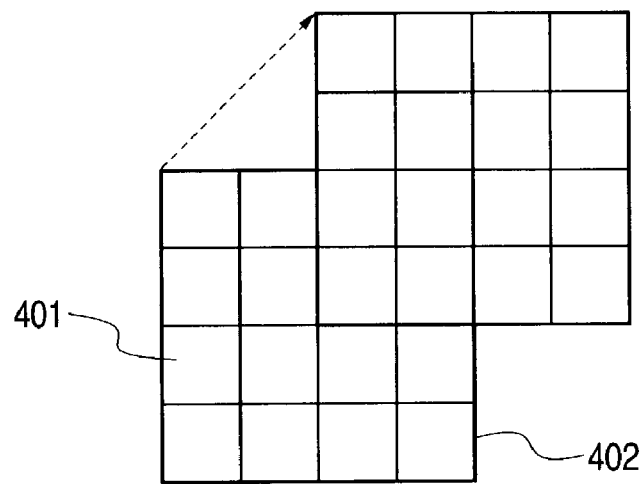
FIGS. 4(a) and 4(b) are diagrams of assistance in explaining another example of the writing method according to the present invention.
Figure 4B:
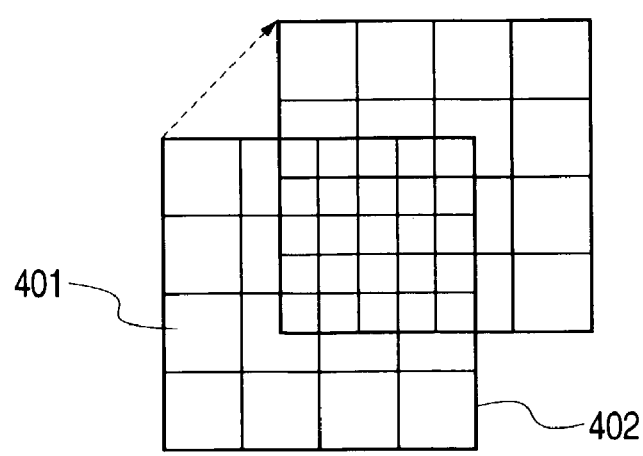
Figure 5A:
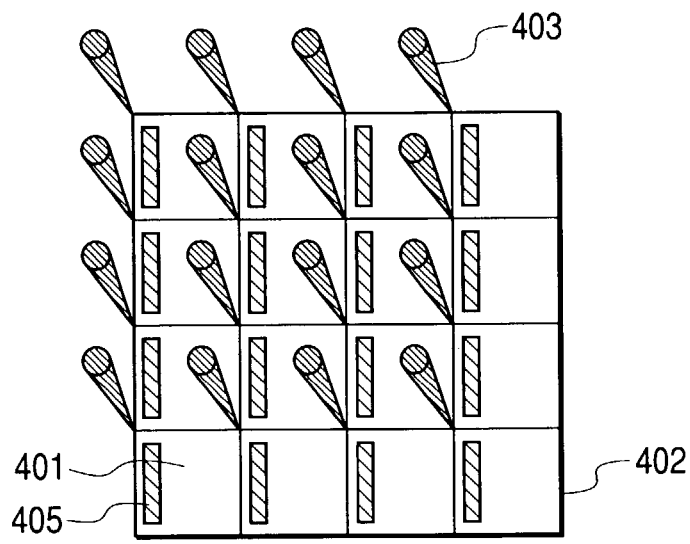
FIGS. 5(a) and 5(b) are diagrams of assistance in explaining an example of a writing pattern according to the present invention.
Figure 5B:
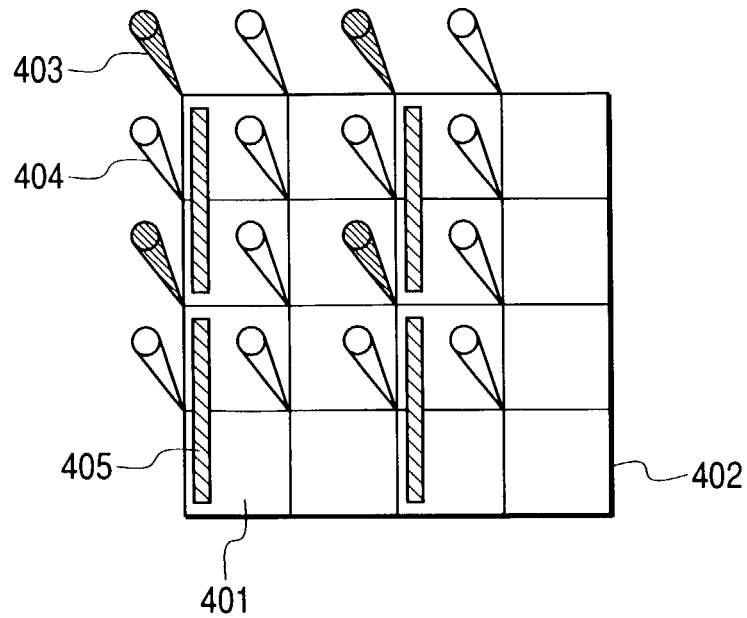
Figure 6:
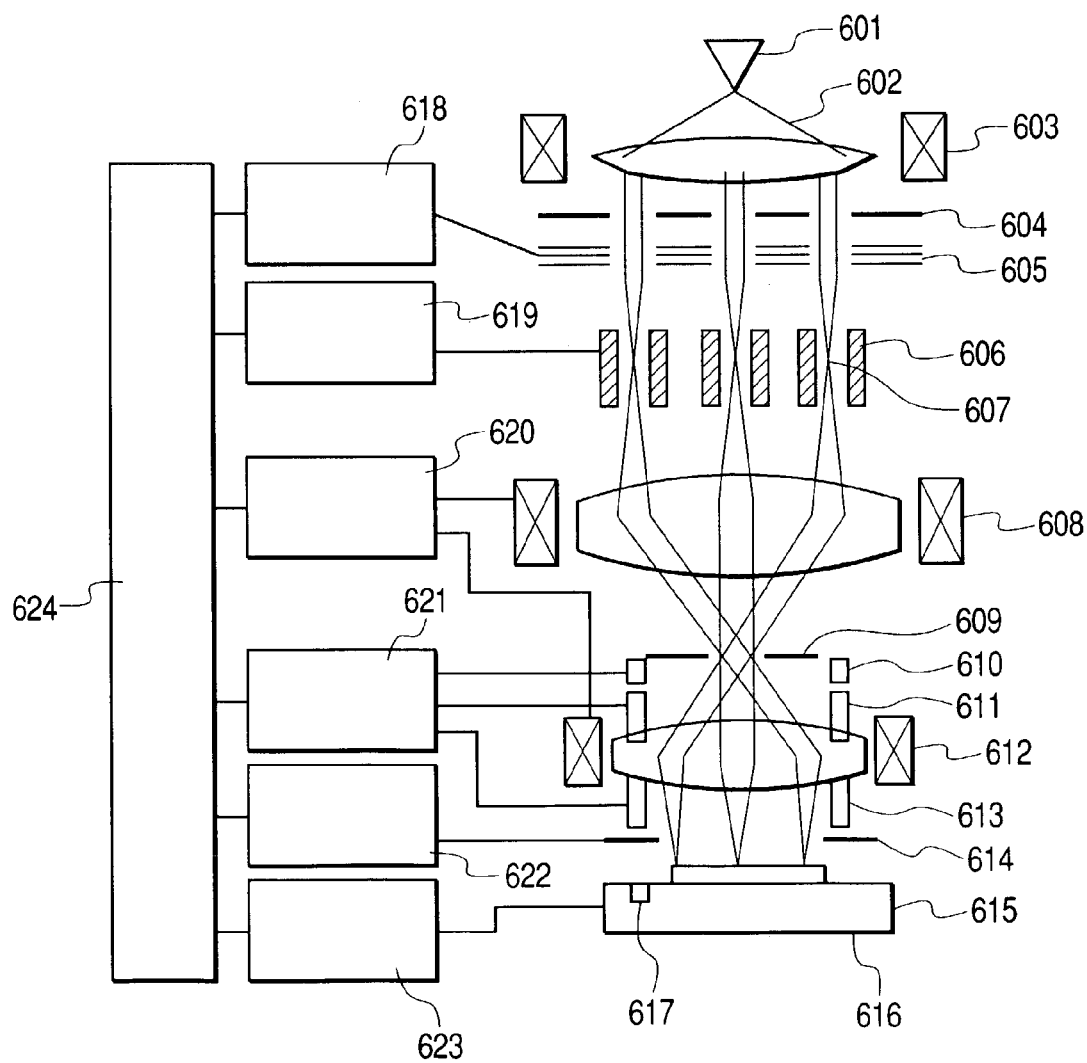
FIG. 6 is a diagram of assistance in explaining an example of an equipment construction for use in embodiments of the present invention.

FIG. 6 shows an equipment construction for use in this embodiment. An electron beam 602 emitted from an electron gun 601 is irradiated onto a plurality of holed aperture arrays 604 through condenser lenses 603 to form multi electron beams. The multi electron beams which pass through aperture arrays 604 form point beams as intermediate images 607 by lens arrays 605, and are then on/off controlled by deflection of blanker arrays 606. The intermediate images 607 are projected onto a wafer 615 on a stage 616 by a lens doublet having first projection lenses 608 and second projection lenses 612. Main deflectors 611 and sub-deflectors 613 act on the multi beams in the same manner to perform positioning on the wafer 615. A Faraday cup 617 is provided on the stage 616 to detect an electron current.

In the drawing, the numeral 609 denotes a blanking aperture; the numeral 610, a dynamic focus and astigmatism adjuster; and the numeral 614, an electron detector. The numerals 618 to 624 show a control system of this equipment construction and denote a focus control circuit, a pattern generating circuit, a lens control circuit, a deflection control circuit, a signal handling circuit, a stage control circuit, and a CPU, respectively.

In FIG. 6, the lens doublet has one stage for simplifying the construction. When increasing the demagnification ratio for high resolution, it is effective that the lens doublets are arrayed in two stages in series.

Figure 7:
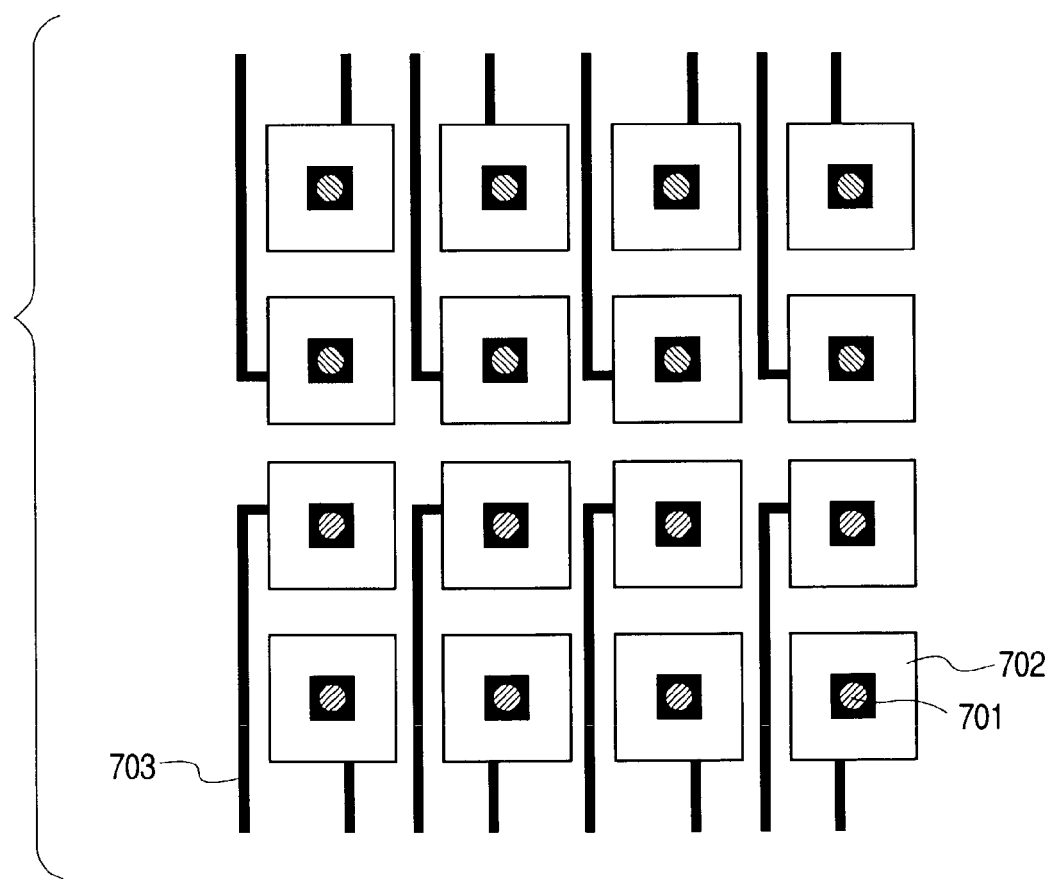
FIG. 7 is a diagram showing a construction example of Faraday cups.

FIG. 7 shows an example of the construction of Faraday cups. A plurality of micro Faraday cups 702 electrically isolated to detect electron currents of multi electron beams 701 via a wire 703 at the same time are arrayed in two dimensions. In this example, the number of the electron beams 701 is 1024 in a 32×32 matrix form. This can detect variation in the multi electron beams from the electron currents measured in the plurality of Faraday cups 702.

Figure 8:
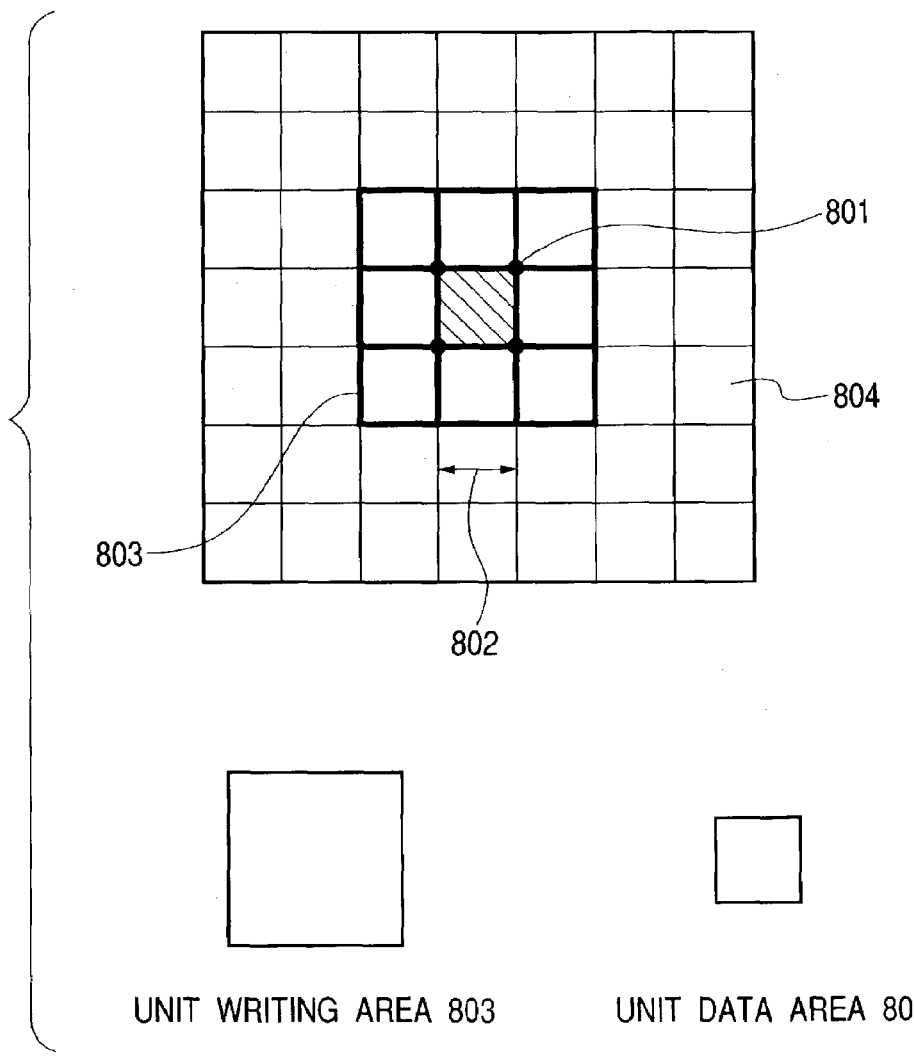
FIG. 8 is a diagram of assistance in explaining a writing area of Embodiment 1 of the present invention.

FIG. 8 shows an example of a writing area. For simplification, only a unit writing area 803 of four electron beams is shown. The diagonally shaded part surrounded by centers 801 of the four electron beams is written with the four electron beams. The deflection position in the unit writing area 803 is different. A smoothing effect can be expected. When the unit writing area is triple, writing with nine electron beams is permitted.

In this embodiment, the electron beam interval is 2 μm and the unit writing area is 4 μm square. The unit writing area is increased, which is not a significant problem because the deflection amount is originally small in the multi beam system. From writing to a resist, the sizing accuracy and the positioning accuracy of the prior art writing method are 10 nm and 30 nm, respectively. According to the present invention, they can be improved to 6 nm and 18 nm, respectively.

(Embodiment 2)

In this embodiment, using the same equipment as Embodiment 1, point beams having an interval of 100 μm are formed in the intermediate images 607 and are condensed to 1/50 by the two-stage lens doublet. The interval of the electron beams is 2 μm as in Embodiment 1. The unit writing area is 2 μm square corresponding to the interval of the electron beams.

In this embodiment, an electron beam center shift method is used. The size of the multi beam area is 64 μm square obtained from 32×32 beams. In this embodiment, the multi beam area is shifted by 31 μm in two directions to perform overwriting. This is 30 times +½ times the interval of the electron beams. Because of double writing, the fraction of the shift amount is ½ to perform overwriting at different deflection positions where possible. The wafer is written with the two different electron beams and deflection positions.

As a result of the writing to a resist, while the sizing accuracy and the positioning accuracy of the prior art writing method are 10 nm and 30 nm, respectively, they can be improved to 8 nm and 22 nm, respectively. The multi beam area is shifted by 20.7 μm in two directions to perform overwriting three times. The sizing accuracy and the positioning accuracy can be improved to 7 nm and 20 nm, respectively.

(Embodiment 3)

Figure 9A:
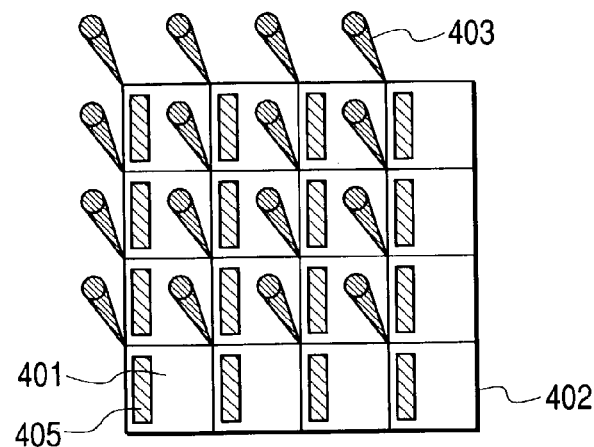
FIGS. 9(a) to 9(c) are diagrams of assistance in explaining writing patterns of Embodiment 3 of the present invention.
Figure 9B:
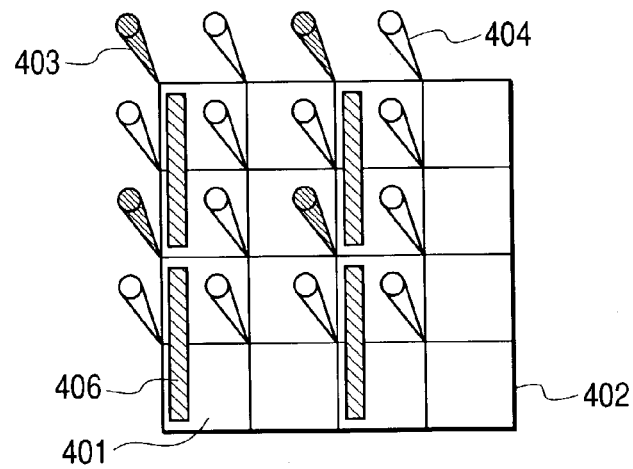
Figure 9C:
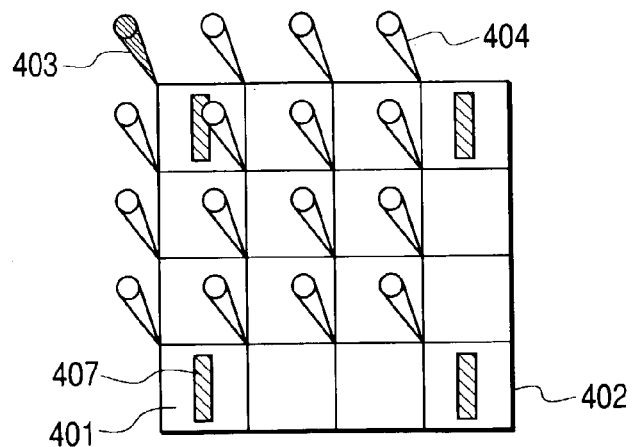

FIGS. 9(a) to 9(c) show part of the patterns used in this embodiment. Writing is performed to a resist having a thickness of 0.3 μm to optically measure the positions of the developed results. This can measure variation in the electron beams. The data is fed back to the data control system of the writing equipment to improve the writing accuracy.

In the current state, an optical measurement device has the highest measurement accuracy. Use of this is effective to improve the accuracy of the equipment. In the multi beam system, the electron current of each of the electron beams is small. It is thus difficult to make the measurement accuracy higher with the electron beam itself. The relative positions between the multi electron beams need not be measured in the prior art, which is a new trial.

Measurement is performed in a writing pattern 405 within 2 μm as shown In FIG. 9(a). A unit writing area 401 given to one beam is small. It is thus difficult to optimize the parameter of optical measurement. A given value is fed back to the equipment control to improve the prior art positioning accuracy from 30 nm to 25 nm.

A writing pattern 406 shown in FIG. 9(b) is used. The unit writing area 401 is 4 μm square to improve the measurement accuracy. The positioning accuracy can be improved to 22 nm. In this method, an adjacent electron beam cannot be used at a time. Writing must be done multiple times, which is not a significant problem. Since a multi beam area 402 is small, writing can be made onto the same wafer.

As shown in FIG. 9(c), the area per electron beam is increased to arrange a plurality of writing patterns 407. The positions of the plurality of writing patterns in the unit writing area 401 can be known. The shapes can be corrected. The shapes are basically common in all the electron beams. They may be different depending on the position due to influence of aberration. Measurement with multi beams is preferable. This is fed back to the data control system of the equipment.

Correction of the shape of the unit writing area is particularly important when using the enlarged unit writing area in Embodiment 1. Use of a combination thereof is very effective. The positioning accuracy can be improved to 20 nm. Using the writing method of Embodiment 1 together can improve it to 15 nm.

In these embodiments, multi electron beams are formed from a single electron source. The present invention can be executed using a plurality of electron sources. In this case, the number of electron optical elements in a vacuum can be reduced. Variation in the characteristics of the electron sources is the disadvantage.

As described above, according to the present invention, the writing accuracy in the writing equipment of a multi electron beam system can be improved.

What is claimed is:

1. Electron beam writing equipment comprising:
   means for generating plural electron beams;
   means for controlling on/off of each of said plural electron beams according to pattern data to be written; and
   means for forming desired patterns on a wafer by scanning a writing area which includes a plurality of unit writing areas in each of which one of said plural electron beams is scanned, said on/off controlled electron beams together forming said desired patterns on a wafer,
   wherein a center of the writing area is shifted to an already written area, and
   wherein a center of each of the unit writing areas is shifted by substantially an integral multiple of the beam interval of the plural electron beams or by substantially an integral multiple and substantially 1/integer of the beam interval of the plural electron beams.

2. The electron beam writing equipment according to claim 1, further comprising a plurality of Faraday cups arrayed to receive said plural electron beams to detect variation in said plural electron beams.

3. An electron beam writing method comprising the steps of:
   generating plural electron beams;
   on/off controlling each of the plural electron beams according to pattern data to be written; and forming desired patterns on a wafer by scanning a writing area which includes a plurality of unit writing areas in each of which one of the plural electron beams is scanned, wherein a center of the writing area is shifted to an already written area, and wherein a center of each of the unit writing areas is shifted by substantially an integral multiple of the beam interval of the plural electron beams or by substantially an integral multiple and substantially 1/integer of the beam interval of the plural electron beams.

4. The electron beam writing method according to claim 3, wherein one side of each of said unit writing areas is larger than the beam interval of said plural electron beams.

5. The electron beam writing method according to claim 3, wherein the positions of said patterns are optically measured.

6. The electron beam writing method according to claim 3, wherein the positions of said patterns written at a position closer to the center of a position of a second adjacent electron beam than to the center of a position of a first electron beam of said electron beams is measured optically so as to correct said pattern.

7. Electron beam writing equipment, comprising:

an aperture array;

a blanker array arranged to receive the plural electron beams and to on/off control passage of the electron beams; and an optical system arranged to scan a writing area of a subject so as to form a desired pattern;

wherein the writing area includes a plurality of unit writing areas in each of which one of said plural electron beams is scanned, wherein a center of the writing area is shifted to an already written area, and wherein a center of each of the unit writing areas is shifted by substantially an integral multiple of the beam interval of the plural electron beams or by substantially an integral multiple and substantially 1/integer of the beam interval of the plural electron beams.

8. The electron beam writing equipment, according to claim 7, further comprising: a plurality of Faraday cups arrayed to receive said plural electron beams to detect variation in said plural electron beams.

9. The electron beam writing method according to claim 3, wherein positions of said patterns are measured to obtain relative positions between said electron beams so that said patterns are corrected.

10. The electron beam writing method according to claim 1, wherein one side of each of said unit writing areas is larger than the beam interval of said plural electron beams.

11. The electron beam writing method according to claim 7, wherein one side of each of said unit writing areas is larger than the beam interval of said plural electron beams.

* * * * *